US007538695B2

(12) United States Patent
Laker et al.

(10) Patent No.: US 7,538,695 B2

(45) Date of Patent: May 26, 2009

(54) SYSTEM AND METHOD FOR DEFLATE PROCESSING WITHIN A COMPRESSION ENGINE

(75) Inventors: Robert William Laker, Fremont, CA (US); David T Hass, Santa Clara, CA (US)

(73) Assignee: RMI Corporation, Cupertino, CA (US)

( * ) Notice: Subject to any disclaimer, the term of this patent is extended or adjusted under 35 U.S.C. 154(b) by 0 days.

(21) Appl. No.: 11/824,501

(22) Filed: Jun. 29, 2007

(65) Prior Publication Data

US 2009/0006510 A1 Jan. 1, 2009

(51) Int. Cl.
*H03M 7/34* (2006.01)

(52) U.S. Cl. ............................ 341/51; 351/50; 351/56; 351/67; 351/82

(58) Field of Classification Search .................. 341/50, 341/51, 55, 67, 82
See application file for complete search history.

(56) References Cited

U.S. PATENT DOCUMENTS 5,406,279 A * 4/1995 Anderson et al. ............ 341/51
5,640,158 A * 6/1997 Okayama et al. .............. 341/51
6,597,812 B1 * 7/2003 Fallon et al. ................ 382/232
2007/0109153 A1 * 5/2007 Ma et al. ...................... 341/50

OTHER PUBLICATIONS

International Search Report and Written Opinion from PCT Application No. PCT/US08/08107 mailed on Jan. 30, 2009.

* cited by examiner

*Primary Examiner*—Jean B Jeanglaude
(74) *Attorney, Agent, or Firm*—Zilka-Kotab, PC

(57) ABSTRACT

An apparatus to implement a deflate process in a compression engine. An embodiment of the apparatus includes a hash table, a dictionary, comparison logic, and encoding logic. The hash table is configured to hash a plurality of characters of an input data stream to provide a hash address. The dictionary is configured to provide a plurality of distance values in parallel based on the hash address. The distance values are stored in the dictionary. The comparison logic is configured to identify a corresponding length for each matching distance value from the plurality of distance values. The encoding logic is configured to encode the longest length and the matching distance value as a portion of a LZ77 code stream.

42 Claims, 7 Drawing Sheets

SYSTEM AND METHOD FOR DEFLATE PROCESSING WITHIN A COMPRESSION ENGINE

BACKGROUND

LZ77 is the common name of a lossless data compression algorithm. LZ77 is used as a part of the GNU zip (gzip) DEFLATE process, as specified in RFC 1951. FIG. 1 illustrates a conventional compression application 10 which uses the DEFLATE process to transform a file 12 into a compressed file 14. An inverse operation, denoted the INFLATE process, is used to decompress the compressed file 14 to recreate the original file 12. In the DEFLATE process, files 12 are first compressed using LZ77, and then the resulting LZ77 code is Huffman coded to provide an even better compression performance.

FIG. 2 illustrates a conventional LZ77 process 20. In the conventional LZ77 process 20, the file 12 is read character by character. In FIG. 2, the file 12 is represented by the incoming data stream 22, which is subdivided into bytes. Each byte represents one character. Each character is hashed with the preceding two characters, using a hash table 24, to provide a hash address into a dictionary. In conventional software implementations of gzip, the dictionary contains an index into a linked list 26, which contains a series of addresses (ending with a null address). Each address in the linked list 26 points to a place in the input stream, which is stored in a byte buffer 28, where the same sequence of three characters has occurred previously. In the conventional LZ77 process 20, the previous characters of the input data stream 22 are copied into the byte buffer 28, and the addresses of the linked list 26 point to locations in the byte buffer 28. Typically, these addresses are valid for positional distances up to 32K characters, because the byte buffer 28 stores the previous 32K characters.

In conventional software implementations of the LZ77 process 20, the input data stream is compared to the previous bytes (i.e., the bytes in the byte buffer 28 at the location pointed to by the address in the linked list 26) to determine how many bytes are similar. The comparator 30 performs this comparison for each address in the series of addresses corresponding to the hash address until it finds a suitable match. In other words, this process is performed serially for each address in the linked list 26 that corresponds to the hash address. The serial nature of these operations affects the speed of the conventional LZ77 implementation. Additionally, the performance of the conventional LZ77 implementations is affected by the size of the linked list 26.

The LZ77 process 20 then encodes the distance (corresponding to the location in the byte buffer 28) and the length (corresponding to the number of similar bytes starting at the location in the byte buffer 28) of the match to derive part of the LZ77 code stream. If there is no suitable match, the current byte is output as a literal, without further encoding. Hence, the LZ77 code stream is made up of encoded distance/length pairs and literals. The LZ77 code stream is then supplied to a Huffman encoder for further compression.

SUMMARY

Embodiments of a method are described. In one embodiment, the method is a method for DEFLATE processing within a compression engine. An embodiment of the method includes hashing a plurality of characters of an input data stream to provide a hash address into a dictionary. The method also includes reading a plurality of distance values in parallel from the dictionary based on the hash address. The distance values are stored in the dictionary. The method also includes identifying a corresponding length value for each of the plurality of distance values via a matching process. The method also includes encoding the longest length value and the matching distance value as a portion of a LZ77 code stream. Other embodiments of the method are also described.

Embodiments of an apparatus are also described. In one embodiment, the apparatus is an apparatus to implement a DEFLATE process in a compression engine. An embodiment of the apparatus includes a hash table, a dictionary, comparison logic, and encoding logic. The hash table is configured to hash a plurality of characters of an input data stream to provide a hash address. The dictionary is coupled to the hash table. The dictionary is configured to provide a plurality of distance values in parallel based on the hash address. The distance values are stored in the dictionary. The comparison logic is coupled to the dictionary. The comparison logic is configured to identify a corresponding length value for each of the plurality of distance values. The encoding logic is coupled to the comparison logic. The encoding logic is configured to encode the longest length value and the matching distance value as a portion of a LZ77 code stream. Other embodiments of the apparatus are also described.

Other aspects and advantages of embodiments of the present invention will become apparent from the following detailed description, taken in conjunction with the accompanying drawings, illustrated by way of example of the principles of the invention.

BRIEF DESCRIPTION OF THE DRAWINGS

Throughout the description, similar reference numbers may be used to identify similar elements.

DETAILED DESCRIPTION

In the following description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

While many embodiments are described herein, at least some of the described embodiments facilitate reading, in parallel, a plurality (e.g., four) of distance values from a dictionary based on a single hash address. The distance values are used to compare, in parallel, a corresponding plurality of byte streams from a byte buffer with an input data stream. As mismatches are found between the byte streams and the input data stream, the non-matching byte streams are dropped from consideration until a single comparison remains. In some embodiments, the last remaining byte stream is the longest matching byte stream. Alternatively, some embodiments track the lengths of multiple byte streams and perform a priority encode to select the longest. In the event that two or more byte streams are of the same length, the byte stream with the shortest distance value may be chosen so that the resulting LZ77 code potentially contains less data.

Additionally, some embodiments keep the dictionary small in size. For example, some embodiments of the dictionary have about 2K entries (e.g., based on 11-bit entry addresses). Although a smaller dictionary size may mean that more character combinations hash to the same value, the number of unusable hashes can be limited. In one embodiment, the dictionary also stores one or more characters (e.g., the first two characters) from the corresponding byte stream in the byte buffer. When the addresses are read out from the dictionary, the corresponding characters are compared with the input data stream, and the addresses corresponding to non-matching characters are discarded. This may limit the number of unusable hashes and decrease the time that the hardware spends comparing the byte streams from the byte buffer with the input data stream.

In some embodiments, the byte buffer is arranged to store sixteen bytes in each storage location. This allows a comparison of up to sixteen bytes per cycle (although the first and last cycles of a matching operation may compare less than sixteen bytes). By allowing comparisons of sixteen bytes at a time, match operations may be accelerated.

Additionally, some embodiments update the dictionary whenever a literal is output or at the end of each matching operation. In some embodiments, the dictionary is not updated on every byte comparison (unlike conventional software implementations). This exemplary update schedule offers acceptable performance since the dictionary uses four match positions. Also, this update schedule may save cycles where a single-ported dictionary random access memory (RAM) is implemented.

Figure 3:
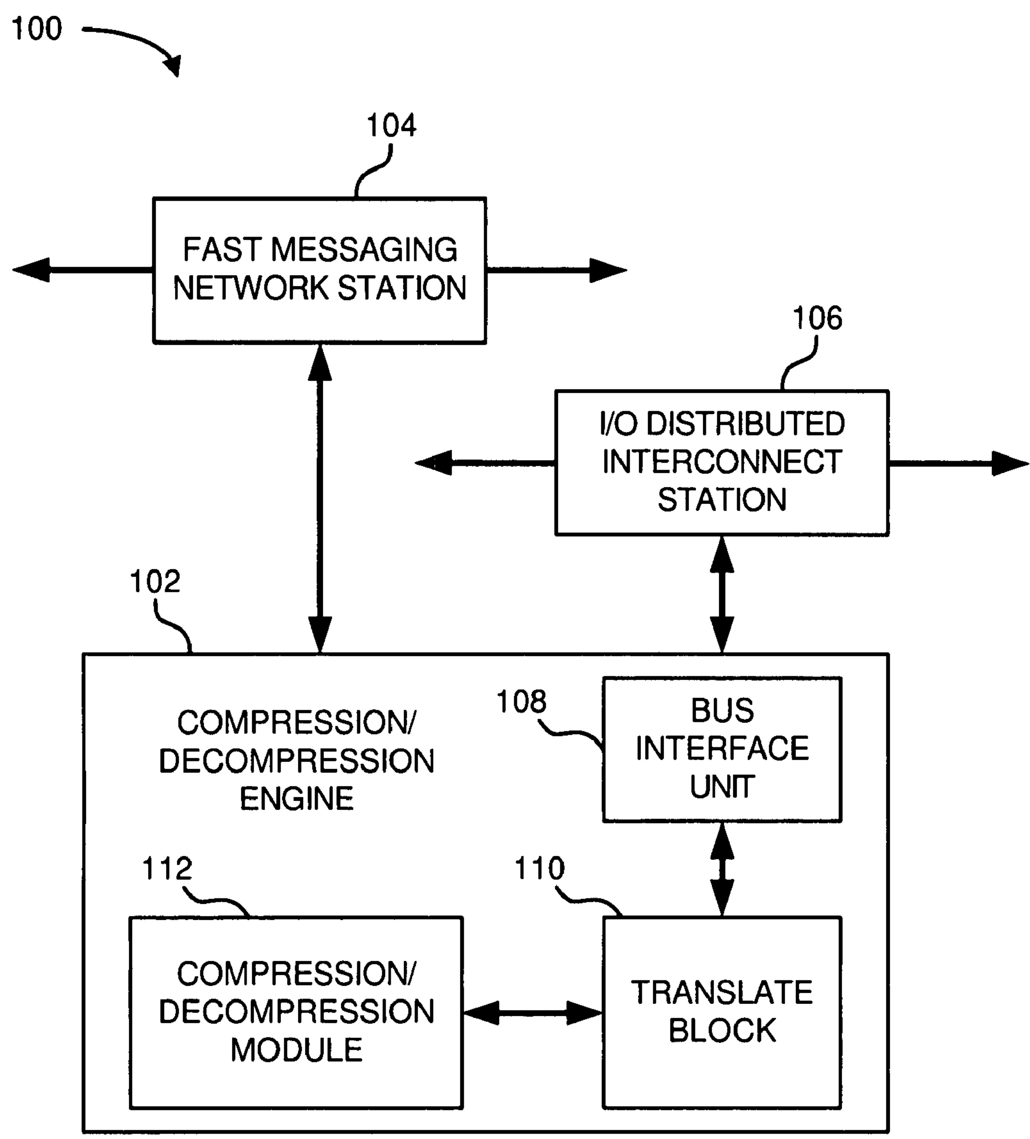
FIG. 3 depicts a schematic block diagram of one embodiment of a computing environment.

FIG. 3 depicts a schematic block diagram of one embodiment of a computing environment 100. The illustrated computing environment 100 includes a compression/decompression engine (CDE) 102, a fast messaging network (FMN) station 104, and an input-output (I/O) distributed interconnect station 106. An exemplary embodiment of the CDE 102 is described in more detail below.

In one embodiment, the I/O distributed interconnect station 106 is part of a high speed distributed interconnect ring which connects multiple cores, caches, and processing agents. The high speed distributed interconnect ring supports simultaneous transactions among the connected components.

The FMN 104 provides a channel for messages directed to and from the CDE 102. In some embodiments, the messages may direct the CDE 102 to perform compression or indicate completion of a compression operation.

Figure 4:
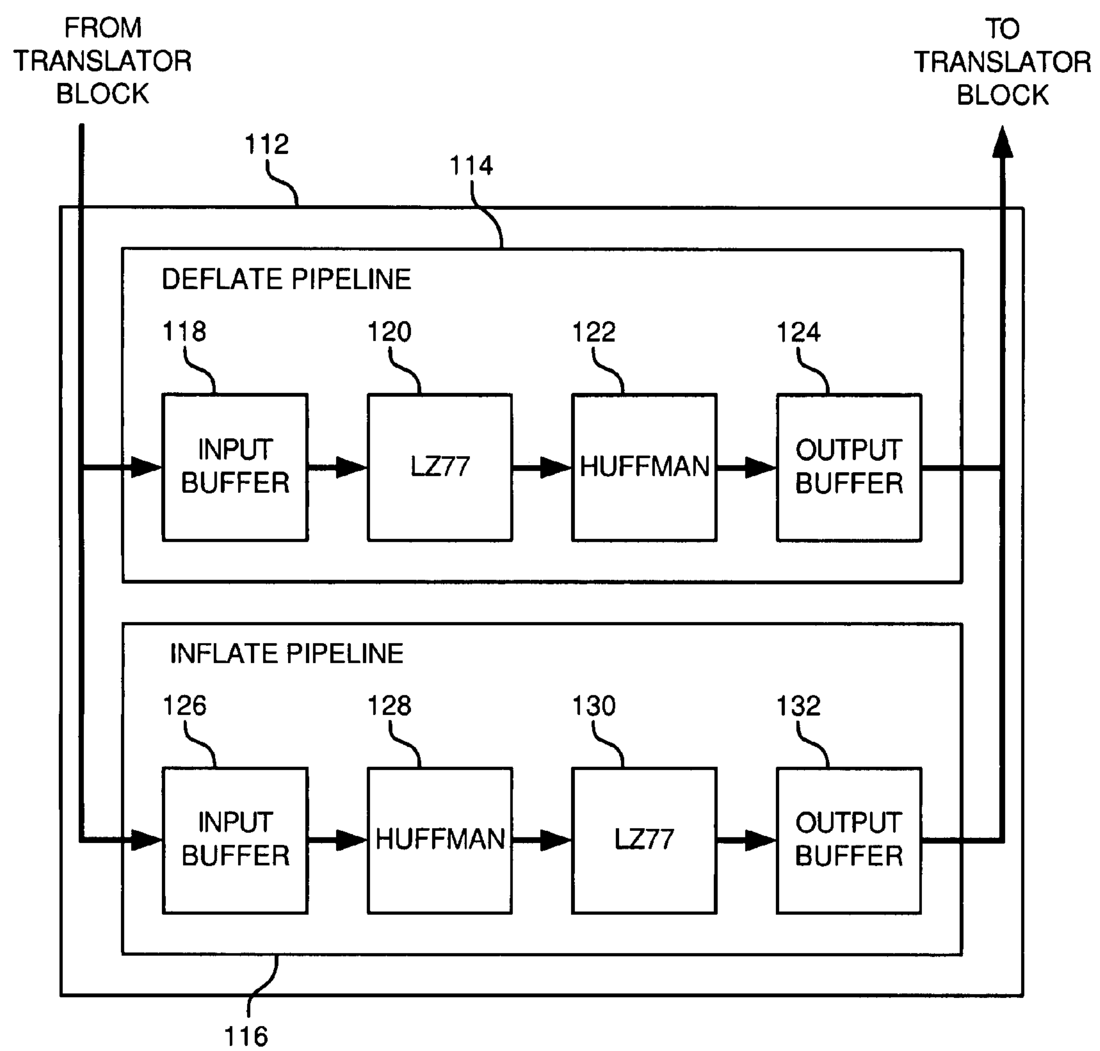
FIG. 4 depicts a schematic block diagram of a more detailed embodiment of the compression/decompression module shown in FIG. 3.

In general, the CDE 102 is configured to compress and decompress files for transfer within the computing environment 100. Alternatively, other embodiments of the CDE 102 may be implemented in other computing environments in which compressed files may be used. The illustrated CDE 102 includes a bus interface unit (BIU) 108, a translate block (XLT) 110, and a compression/decompression module (CDM) 112. The BIU 108 provides a data interface to the I/O distributed interconnect station 106 and the I/O distributed interconnect ring. The XLT 110 provides an interface between the BIU 108 and the CDM 112. In one embodiment, the XLT 110 uses its own direct memory access (DMA) engine to read and write data via the BIU 108, so the XLT 110 may operate autonomously from a central procession unit (CPU) coupled to the computing environment 100. The CDM 112 performs compression and decompression operations for the CDE 102. A more detailed embodiment of the CDM is shown in FIG. 4 and described below. Other embodiments of the CDE 102 may include fewer or more components. Additionally, other embodiments of the CDE 102 may implement more or less functionality than is described herein.

FIG. 4 depicts a schematic block diagram of a more detailed embodiment of the compression/decompression module (CDM) 112 shown in FIG. 3. The illustrated CDM 112 includes a DEFLATE pipeline 114 and an INFLATE pipeline 116. The DEFLATE pipeline 114 is available to implement the CDE compression process, also referred to as the DEFLATE process. The illustrated DEFLATE pipeline 114 includes an input buffer 118, LZ77 logic 120, Huffman logic 122, and an output buffer 124. The INFLATE pipeline 116 is available to implement the CDE decompression process, also referred to as the INFLATE process. The illustrated INFLATE pipeline 116 includes an input buffer 126, Huffman logic 128, LZ77 logic 130, and an output buffer 132. Although each pipeline is shown with individual schematic components, at least some of the components may operate in conjunction with both pipelines 114 and 116 using a single implementation. Other embodiments of the CDM 112 may incorporate fewer or more components.

Figure 1:
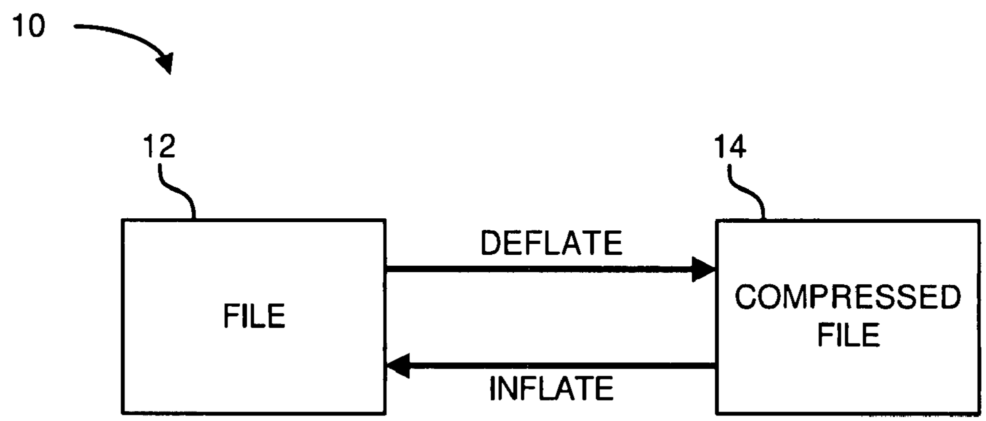
FIG. 1 illustrates a conventional compression application which uses the DEFLATE process to transform a file into a compressed file.
Figure 2:
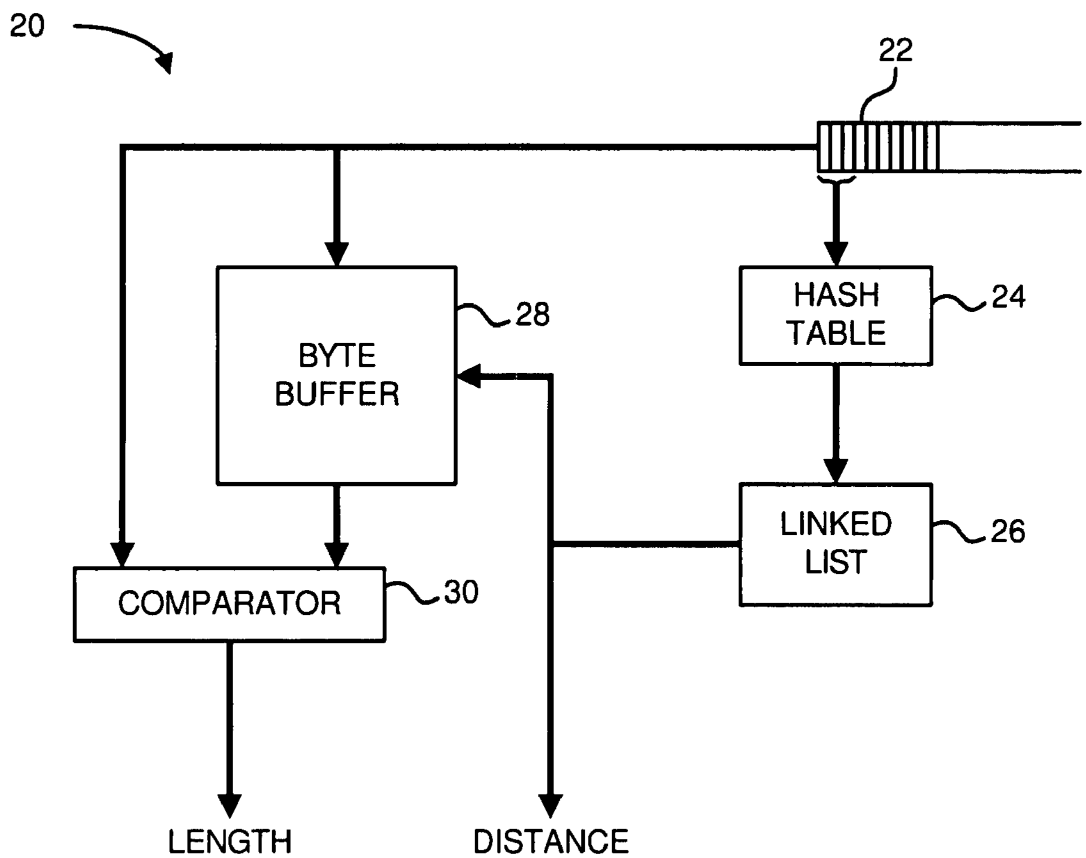
FIG. 2 illustrates a conventional LZ77 process.

For both the DEFLATE pipeline 114 and the INFLATE pipeline 116, the CDM supports various operating modes, including static compression, dynamic compression, and no compression. A file such as the file 12 of FIG. 1 may be split into blocks, and each block may use any of the three modes. Hence, the various blocks of a single file may be compressed using any combination of these three modes.

For the DEFLATE process, splitting the file into blocks is performed as a pre-process before the file is presented to the CDE 102. The CDE 102 then compresses each block and uses bit-stitching to recombine the compressed blocks in the deflated bit stream. For the INFLATE process, the deflated bit stream is input to the CDE 102 and the CDE decompresses the blocks individually, according to the block header information within the bit stream.

The DEFLATE and INFLATE processes use two algorithms to achieve compression. The LZ77 algorithm, implemented by the LZ77 logic 120 for the DEFLATE process, creates a dictionary of strings of bytes that have occurred previously in the file. In one embodiment, the LZ77 logic 120 enforces a minimum string length (e.g., three bytes) for the byte strings in the dictionary. The LZ77 logic 120 then replaces strings with a distance value (e.g., up to 32,768 bytes) and a length value (e.g., up to 258 bytes) for a matching string. If no match exists, then the incoming byte is output as a literal character.

Subsequently, the Huffman logic 122 (for the DEFLATE process) implements the Huffman algorithm to replace the literal, length, and distance codes with codes whose length depends on the frequency of occurrence of the LZ77 codes in the block. More specifically, the Huffman logic 122 implements one of three coding modes: static compression, dynamic compression, and no compression. For static compression, a predefined code is used which is not necessarily ideal for the block being coded, but still typically achieves good compression. Static compression coding may be executed relatively quickly. Dynamic compression coding, in contrast, may be slower since it uses two passes-one pass to create a statistics table of the frequency of occurrence of each LZ77 code and to generate an optimized Huffman code, and a second pass to make use of the Huffman code to encode the LZ77 data. Although dynamic coding may be slower than static coding, in some instances, it also may result in a higher compression ratio.

It should also be noted that some input files, or data such as embedded image data within a file, may already be in a compressed format. As a result, the static and dynamic coding techniques of the Huffman logic 122 may be unable to compress such data further, or potentially may increase the size of the compressed data. For these types of input files, the Huffman logic 122 may implement a format without further compression (i.e., the "no compression mode"). In this mode, the data are split into blocks, with each block having up to approximately 65,535 bytes in size. The compression process also adds a header for this data type and then outputs the data stream as is.

Figure 5:
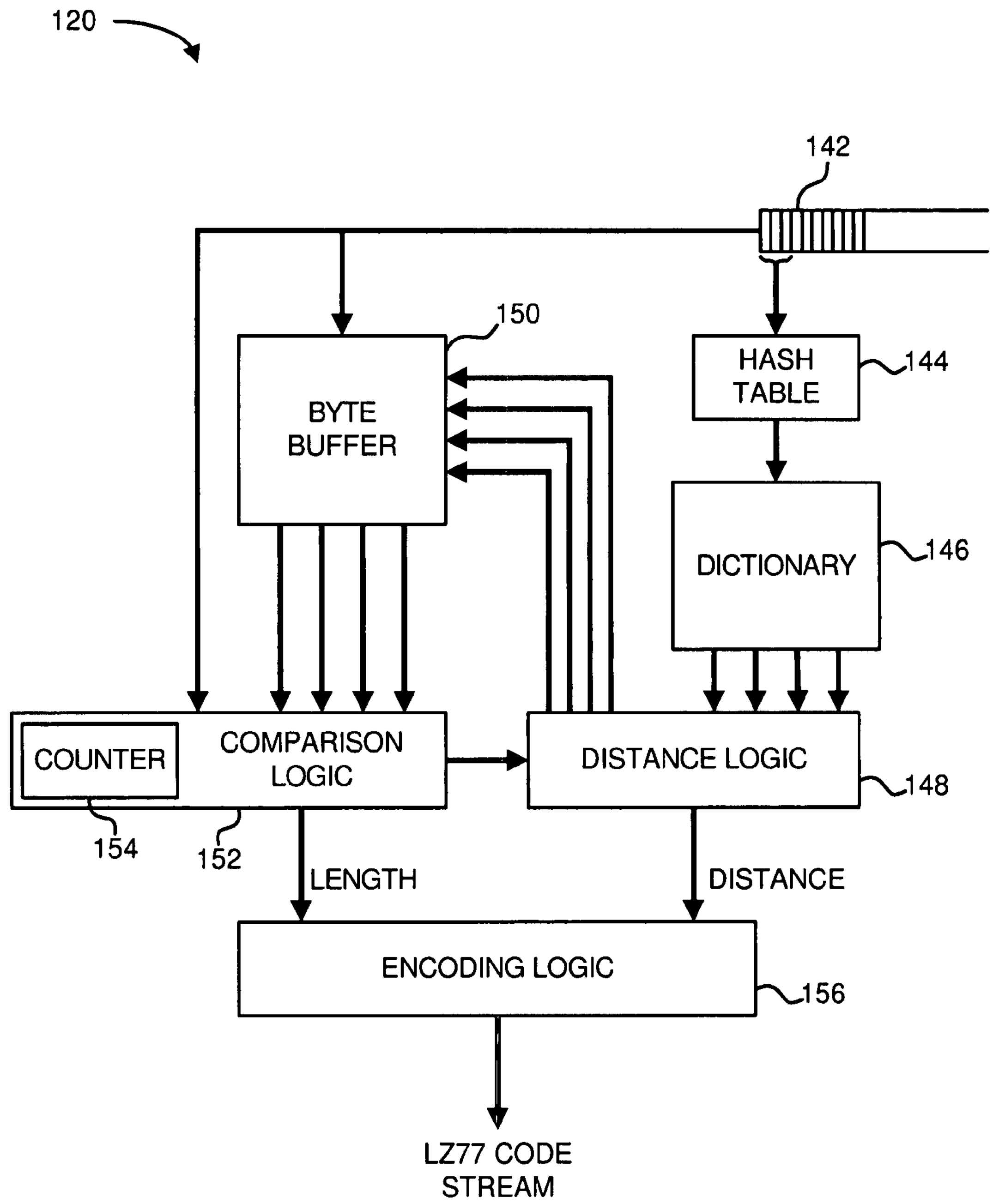
FIG. 5 depicts a schematic block diagram of one embodiment of the LZ77 process that may be implemented by the LZ77 logic of the compression/decompression module shown in FIG. 4.

FIG. 5 depicts a schematic block diagram of one embodiment of the LZ77 process that may be implemented by the LZ77 logic 120 of the compression/decompression module (CDM) 112 shown in FIG. 4. The illustrated LZ77 logic 120 receives an input data stream 142 and includes a hash table 144, a dictionary 146, distance logic 148, a byte buffer 150, comparison logic 152 with one or more counters 154, and encoding logic 156. Other embodiments of the LZ77 logic 120 may include fewer or more components or may implement more or less functionality.

Within the CDE 102, data are received from the XLT 110 by the input buffer 118 of the DEFLATE pipeline 114. In one embodiment, the input buffer 118 is a first-in-first-out (FIFO) buffer. In some embodiments, the data are received as 32-byte cache lines, with a byte count to indicate how many bytes are valid on the last word. Words are then written by the LZ77 logic 120 to both a 128-byte input buffer (not shown) and to the byte buffer 150. In one embodiment, the byte buffer 150 is a 32-Kbyte buffer which stores up to the last 32 Kbytes of the input data stream 142. The data stored in the byte buffer 150 are used, at least in some instances, as reference data whenever a match is being determined.

As the input data stream 152 (e.g., an input file) is read character by character, each character is hashed with the preceding two characters, using the hash table 144, to provide a hash address into the dictionary 146. The dictionary 146 stores buffer locations for matching. In one embodiment, every 3 input bytes from the input data stream 142 are hashed to provide an 11-bit address. Based on the 11-bit hash address, the dictionary 146 may store approximately 2K entries. In each entry of the dictionary 146, up to four possible match entries are stored. In some embodiments, the hash table 144 and the dictionary 146 may be combined into a single, functional block.

In one embodiment, each match entry includes a match position, a valid bit, and the first two characters of the string at the location in the byte buffer 150 indicated by the match position. The inclusion of one or more characters of the string, at the location in the byte buffer 150, within the match entry allows the distance logic 148 to quickly reject one or more of the match entries if the stored characters do not match the characters from the input data stream 142. Hence, in one embodiment, only good matches (i.e., match entries with stored characters that match the characters from the input data stream 142) proceed in the depicted DEFLATE process. Other embodiments of the match entry may include fewer or more match entry fields.

Using the information from the dictionary entry (including, for example, up to four match entries), the locations in the byte buffer 150 are read. In one embodiment, the byte streams beginning at the locations in the byte buffer 150 are read 16 bytes at a time. Each byte stream read from the byte buffer 150 is compared with the bytes from the input data stream 152 by the comparison logic 152. In one embodiment, interleaved reads from the byte buffer 150 allow multiple byte strings to be read and compared simultaneously or at approximately the same time. As an example, up to four streams may be simultaneously read from the byte buffer 150 and compared with the input data stream 142. This comparison process continues until the longest matching byte stream from the byte buffer 150 is found. In one embodiment, the counter 154 (or multiple counters 154) are used to count the progress of each comparison between a byte stream from the byte buffer 150 and the input data stream 142. In another embodiment, the comparison logic 152 may be configured to stop any comparisons that reach a maximum count (e.g., 258 bytes). If multiple byte streams have the same length or reach the maximum count, then the comparison logic 152 may designate one of the byte streams as the best match. In another embodiment, the comparison logic 152 may determine that there are no matches and output the byte from the input data stream 142 as a literal.

Once a longest matching byte stream is identified, or a best match is designated, the comparison logic 152 and the distance logic 148 provide a length value and a distance value, respectively, to the encoding logic 156. In one embodiment, the encoding logic 156 encodes the length and distance values as part of an LZ77 code stream. Additionally, the encoding logic 156 may output a special code (e.g., a decimal 256) when a block is complete. Where a special code is used, the code may occur only once within the block and is used to indicate the completion of the block. The LZ77 code stream is then passed to the Huffman logic 122 of the DEFLATE pipeline 114.

The INFLATE LZ77 process may be implemented using similar LZ77 logic 130 with complementary functionality. For example, the LZ77 logic 130 of the INFLATE pipeline 116 receives LZ77 coded data from the Huffman logic 128 and uses the LZ77 coded data to reconstruct the original file format. In one embodiment, the LZ77 logic 130 uses the identical32-Kbyte byte buffer 150 used in the DEFLATE process. However, in the INFLATE process the byte buffer 150 is used as the source of the strings specified by the distance and length values provided by the Huffman logic 128. Each decoded byte is output to the XLT 110 and is written to the byte buffer 150. In one embodiment, using the same byte buffer 150 for both DEFLATE and INFLATE processes and, hence, saving chip area is possible because the DEFLATE and INFLATE processes are not implemented simultaneously. In one embodiment, the LZ77 logic 130 provides the decompressed, reconstructed file data to the XLT 110 via the output buffer 132 and a 16-byte wide bus.

Figure 6:
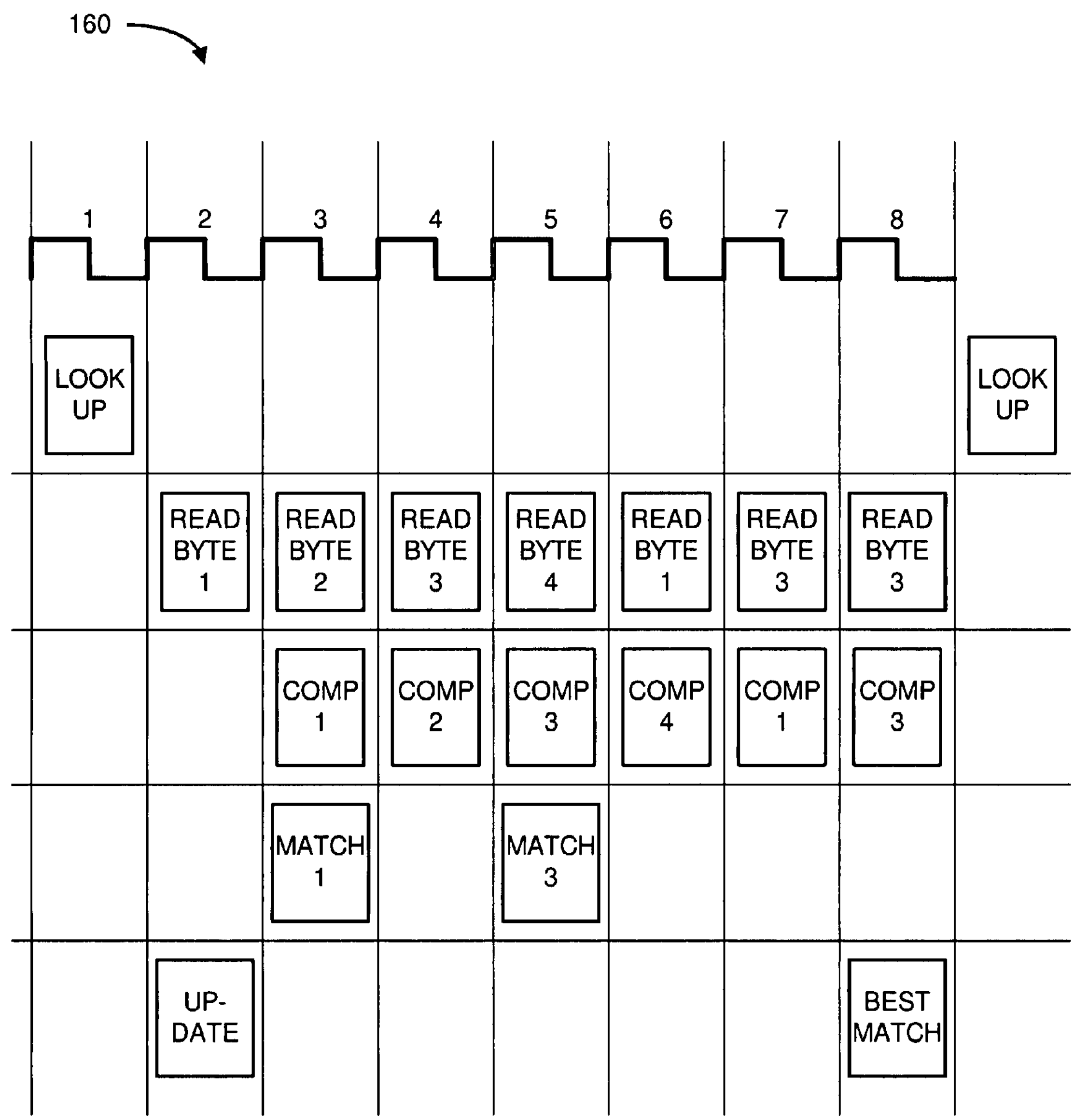
FIG. 6 depicts a schematic timing diagram of one embodiment of a data flow for the LZ77 process shown in FIG. 5.

FIG. 6 depicts a schematic timing diagram 160 of one embodiment of a data flow for the LZ77 process shown in FIG. 5. In general, the illustrated timing diagram 160 shows how read (READ) and comparison (COMP) operations may be interleaved for multiple byte streams from the byte buffer 150. Although the exemplary timing diagram 160 shows interleaved operations for four byte streams, other embodiments may interleave fewer or more byte streams.

In cycle 1, there is a dictionary lookup operation to look up four distance values (e.g., stored in the four match entries of a dictionary entry corresponding to the hash address) from the dictionary 146. For each of the distance values, the comparison logic 152 reads bytes from the byte buffer 150 over the following cycles. In one embodiment, the comparison logic 152 reads a first byte for the first byte stream (i.e., byte stream "1") during cycle 2 of the timing diagram 160. In cycle 3, the comparison logic 152 reads the first byte for the second byte stream (i.e., byte stream "2"). Additionally, the comparison logic 152 compares the first byte from the first byte stream with the first byte from the input data stream 142. In the depicted example, the first bytes of the first byte stream and the input data stream 142 are a match.

In cycle 4, the comparison logic 152 reads the first byte for the third byte stream (i.e., byte stream "3") and compares the first byte from the second byte stream with the first byte from the input byte stream 142. In this example, the first bytes from the second byte stream and the input data stream 142 are not a match. Hence, the second byte stream is dropped.

In cycle 5, the comparison logic 152 reads the first byte for the fourth byte stream (i.e., byte stream "4") and compares the first byte from the third byte stream and the first byte from the input byte stream 142. In this example, the first bytes from the third byte stream and the input data stream 142 are a match. In cycle 6, the comparison logic 152 reads the second byte for the first byte stream (i.e., byte stream "1") and compares the first byte from the fourth byte stream with the first byte from the input byte stream 142. In this example, the first bytes from the fourth byte stream and the input data stream 142 are not a match. Hence, the fourth byte stream is dropped, leaving only the first and third byte streams.

In cycle 7, the comparison logic 152 reads the second byte for the third byte stream (i.e., byte stream "3") and compares the second byte from the first byte stream with the second byte from the input byte stream 142. In this example, the second bytes from the first byte stream and the input data stream 142 are not a match. Hence, the first byte stream is dropped, leaving only the third byte stream.

In cycle 8, the comparison logic 152 reads the third byte for the third byte stream (i.e., byte stream "3") and compares the second byte from the third byte stream with the second byte from the input byte stream 142. In this example, the second bytes from the third byte stream and the input data stream 142 are not a match. However, since the third byte stream is the last byte stream, the third byte stream is identified as the longest matching byte stream, having a length value. In an alternative embodiment, the comparison logic 152 may designate either the first byte stream or third byte stream as the longest matching byte stream since they have equal length values. After identifying a best match (i.e., the longest matching byte stream), the LZ77 logic 120 may start another LZ77 process on the following cycle for the next byte in the input data stream 142.

Additionally, at least some embodiments of the LZ77 logic 120 allow the dictionary 146 to be updated at about the beginning of the depicted LZ77 process. In one embodiment, each dictionary entry operates like a 4-deep FIFO. When a hash has not occurred before the entire entry is marked invalid in a separate 2K vector stored in an external register, the dictionary update involves writing the first entry and setting it valid. Subsequent dictionary updates shift the entries like in a FIFO. If there are already four entries then the dictionary update may shift the oldest entry out of the dictionary to make room for the new entry. In one embodiment, an entry includes the first two characters (e.g., one byte each) that were used to compute the hash, as well as the current buffer position (e.g., fifteen bits for the block position modulo 32K) and a valid bit (e.g., for a total of 32 bits).

Figure 7:
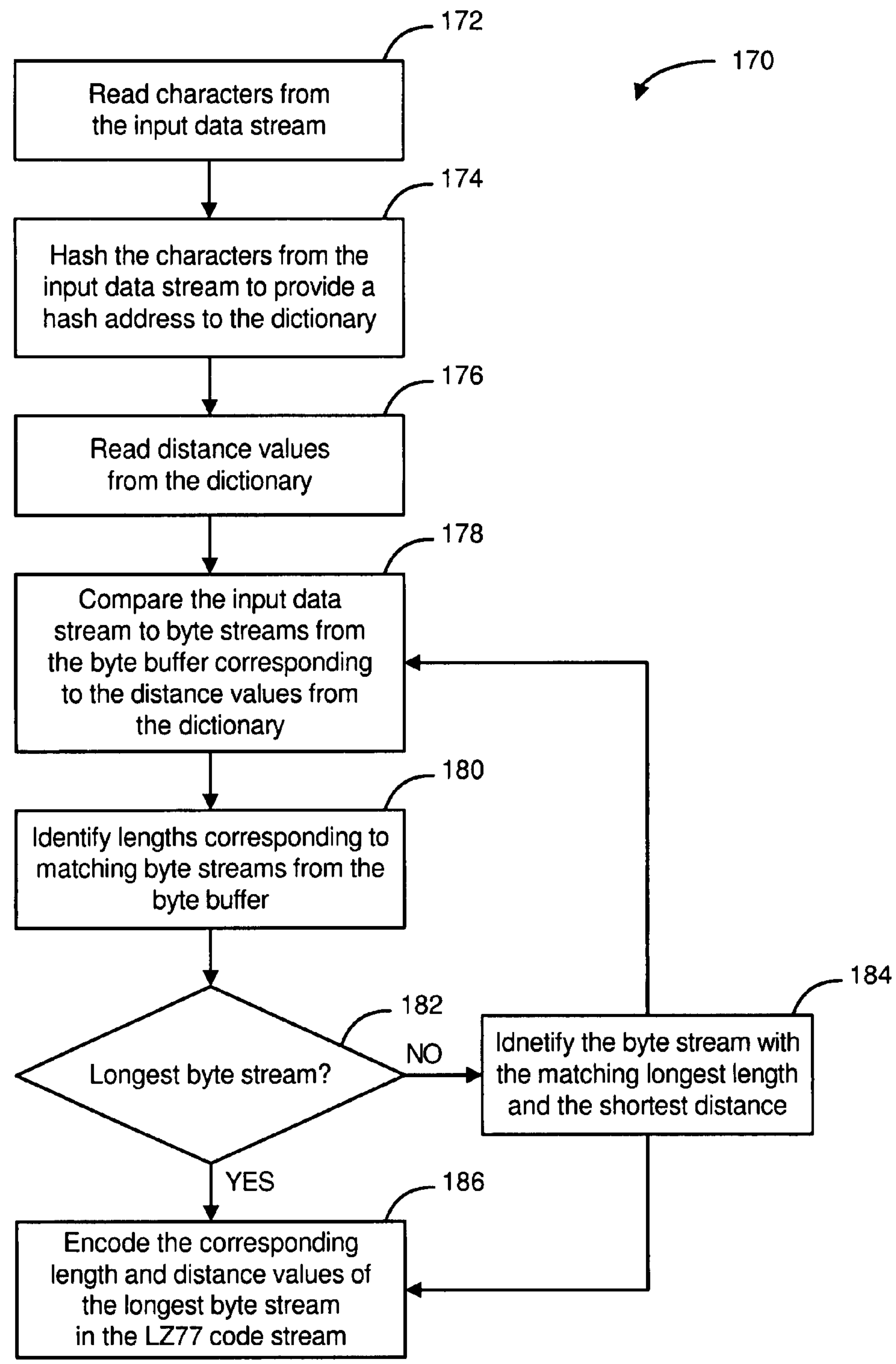
FIG. 7 depicts a schematic flow chart diagram of one embodiment of a compression method that may be implemented in conjunction with the LZ77 logic of the compression/decompression engine shown in FIG. 4.

FIG. 7 depicts a schematic flow chart diagram of one embodiment of a compression method 170 that may be implemented in conjunction with the LZ77 logic 120 of the compression/decompression engine (CDE) 102 shown in FIG. 4. Although the compression method 170 is described with reference to the CDE 102 of FIG. 4, other embodiments may be implemented in conjunction with other compression/decompression engines. Also, it should be noted that at least some of the operations of the illustrated compression method 170 may be implemented in parallel (e.g., interleaved) in order to process multiple byte streams simultaneously or at about the same time.

In the illustrated compression method 170, the hash table 144 reads 172 characters from the input data stream 142. In one embodiment, the hash table 144 reads the current character and the two previous characters from the input data stream 142. Alternatively, the hash table 144 may use a different combination of characters from the input data stream 142. The hash table 144 then hashes 174 the characters from the input data stream 142 to provide a hash address to the dictionary 146. Using the hash address, the dictionary 146 outputs 176 one or more (e.g., up to four) distance values. In one embodiment, the distance values are obtained simultaneously or at about the same time from the dictionary 146.

The comparison logic 152 then obtains a corresponding number of byte streams from the byte buffer 150 using the distance values provided by the dictionary 146. Each byte stream is compared 178 with the input data stream 142 to determine if the byte streams match the input data stream 142. As explained above, if the byte streams from the byte buffer 150 do not match the input data stream 142, then the non-matching byte streams are dropped, or discarded. In one embodiment, the comparison logic 152 identifies 180 the lengths of each matching byte stream from the byte stream buffer 150. The comparison logic 152 then determines 182 if one of the byte streams is the longest matching byte stream. In one embodiment, the comparison logic 152 references the count stored by each of the counters 154 to determine the longest matching byte stream. Ultimately, the byte streams that are not the longest matching byte streams are dropped (and the corresponding length and distance values are discarded). If two or more byte streams have matching lengths that qualify as the longest length, then the comparison logic 152 identifies 184 the byte stream with the matching longest length and the shortest distance. After identifying the byte stream with the longest length or the byte stream with the matching longest length and the shortest distance, the length and distance values for the selected byte stream are encoded 186 in the LZ77 code stream. The illustrated compression method 170 then ends.

As an example, the comparison logic may begin comparisons for four byte streams from the byte buffer 150. If a byte stream fails to match to the end of a 16-byte segment, then the segment is dropped. Otherwise, if the byte stream does match to the end of a 16-byte segment, then the length of the match is unknown until further matching is performed on subsequent 16-byte segments. In one embodiment, even a dropped byte stream may be the longest match even though it is not the last remaining byte stream. In this case, the counters 154 may be used to determine the longest matching byte stream. As a further example, two byte streams may be compared, in which the first byte stream matches 1 byte and the second byte stream matches 15 bytes on the first 16-byte segment. On the second 16-byte segment, the first and second byte streams both match 16 bytes. On the third 16-byte segment, the first byte stream matches 16 bytes and the second byte stream matches 8 bytes. Since the second byte stream does not match to the end of the 16-byte segment, further matching is not performed for the second byte stream. However, the count for the second byte stream is maintained for eventual comparison with the count for the first byte stream. On the fourth 16-byte segment, the first byte stream matches 3 bytes. Thus, the first counter for the first byte stream counts 36 matching bytes (i.e., 1+16+16+3=36), and the second counter for the second byte stream counts 39 matching bytes (i.e., 15+16+8=39). Hence, in this example, the second byte stream is dropped before the first byte stream, but is nevertheless the longest matching byte stream.

Figure 8:
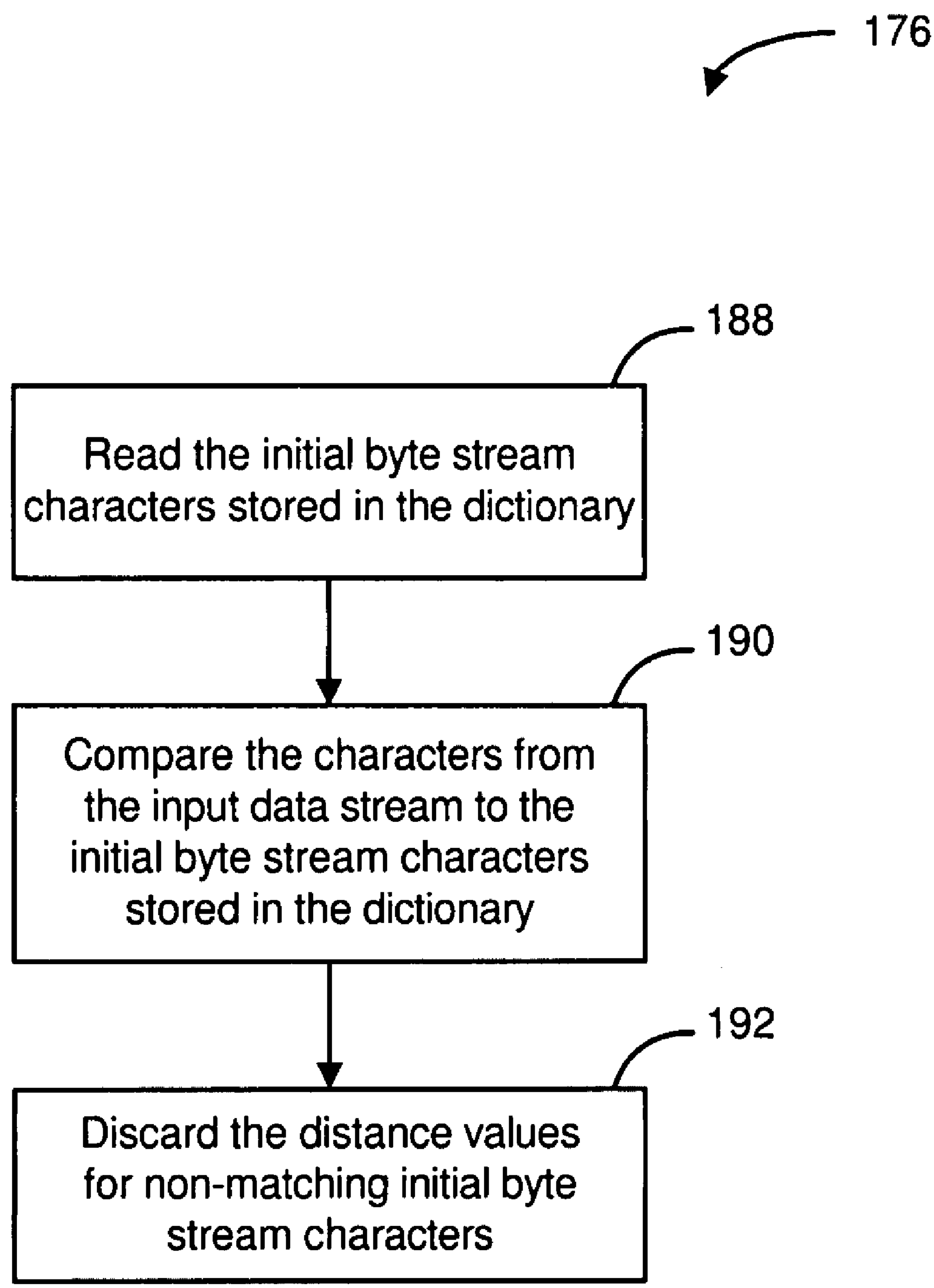
FIG. 8 depicts a schematic flow chart diagram of a more detailed embodiment of the dictionary read operation shown in the compression method of FIG. 7.

FIG. 8 depicts a schematic flow chart diagram of a more detailed embodiment of the dictionary read operation 176 shown in the compression method 170 of FIG. 7. Although the dictionary read operation 176 is described with reference to the CDE 102 of FIG. 4, other embodiments may be implemented in conjunction with other compression/decompression engines. Also, it should be noted that at least some of the operations of the illustrated dictionary read operation 176 may be implemented in parallel (e.g., interleaved) in order to process multiple distance values and/or byte streams simultaneously or at about the same time.

As explained above, each of the match entries in a dictionary entry may include one or more initial characters from the byte streams stored in the corresponding locations in the byte buffer 150. In the illustrated dictionary reading operation 176, the initial byte stream characters stored in the dictionary 146 are read 188 and compared 190 by the distance logic 148 with the corresponding bytes from the input data stream. For each non-matching initial byte stream, the distance logic 148 discards the corresponding distance value so that the comparison logic 152 does not consume any time or resources trying to compare the non-matching byte stream with the input data stream 142. The illustrated dictionary read operation 176 then ends.

It should be noted that embodiments of the methods, operations, functions, and/or logic may be implemented in software, firmware, hardware, or some combination thereof. Additionally, some embodiments of the methods, operations, functions, and/or logic may be implemented using a hardware or software representation of one or more algorithms related to the operations described above. To the degree that an embodiment may be implemented in software, the methods, operations, functions, and/or logic are stored on a computer-readable medium and accessible by a computer processor.

Embodiments of the invention also may involve a number of functions to be performed by a computer processor such as a central processing unit (CPU), a graphics processing unit (GPU), or a microprocessor. The microprocessor may be a specialized or dedicated microprocessor that is configured to perform particular tasks by executing machine-readable software code that defines the particular tasks. The microprocessor also may be configured to operate and communicate with other devices such as direct memory access modules, memory storage devices, Internet related hardware, and other devices that relate to the transmission of data. The software code may be configured using software formats such as Java, C++, XML (Extensible Mark-up Language) and other languages that may be used to define functions that relate to operations of devices required to carry out the functional operations related described herein. The code may be written in different forms and styles, many of which are known to those skilled in the art. Different code formats, code configurations, styles and forms of software programs and other means of configuring code to define the operations of a microprocessor may be implemented.

Within the different types of computers, such as computer servers, that utilize the invention, there exist different types of memory devices for storing and retrieving information while performing some or all of the functions described herein. In some embodiments, the memory/storage device where data is stored may be a separate device that is external to the processor, or may be configured in a monolithic device, where the memory or storage device is located on the same integrated circuit, such as components connected on a single substrate. Cache memory devices are often included in computers for use by the CPU or GPU as a convenient storage location for information that is frequently stored and retrieved. Similarly, a persistent memory is also frequently used with such computers for maintaining information that is frequently retrieved by a central processing unit, but that is not often altered within the persistent memory, unlike the cache memory. Main memory is also usually included for storing and retrieving larger amounts of information such as data and software applications configured to perform certain functions when executed by the central processing unit. These memory devices may be configured as random access memory (RAM), static random access memory (SRAM), dynamic random access memory (DRAM), flash memory, and other memory storage devices that may be accessed by a central processing unit to store and retrieve information. Embodiments may be implemented with various memory and storage devices, as well as any commonly used protocol for storing and retrieving information to and from these memory devices respectively.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A method for deflate processing within a compression engine, the method comprising:

hashing a plurality of characters of an input data stream to provide a hash address into a dictionary;

reading a plurality of distance values in parallel from the dictionary based on the hash address, wherein the distance values are stored in the dictionary;

identifying a matching distance value from the plurality of distance values; and encoding the matching distance value with a length value as a portion of a LZ77 code stream.

2. The method according to claim 1, wherein identifying the matching distance value further comprises:

comparing the input data stream in parallel with a plurality of byte streams from a byte buffer, the plurality of byte streams corresponding to the plurality of distance values from the dictionary; and identifying a longest matching byte stream of the plurality of byte streams.

3. The method according to claim 2, further comprising deriving the length value from the longest matching byte stream of the plurality of byte streams.

4. The method according to claim 2, wherein comparing the input data stream with the plurality of byte streams further comprises comparing a plurality of bytes per cycle from each byte stream with corresponding bytes of the input data stream.

5. The method of claim 4, wherein comparing the plurality of bytes per cycle from each byte stream further comprises comparing up to 16 bytes per cycle from each byte stream with the corresponding bytes of the input data stream.

6. The method according to claim 2, wherein if two or more of the plurality of byte streams are a same length, choosing a byte stream with a shortest distance value.

7. The method according to claim 1, wherein the reading includes reading the plurality of distance values in parallel from the dictionary based on a single hash address.

8. The method according to claim 1, further comprising updating the dictionary at the end of a match operation to identify a longest matching byte stream from a byte buffer.

9. The method according to claim 1, further comprising updating the dictionary in response to an operation to output a literal, wherein the literal comprises another character of the input data stream.

10. The method according to claim 1, further comprising storing approximately 2K entries in the dictionary, wherein each entry comprises a plurality of possible match entries.

11. The method according to claim 10, wherein each entry comprises up to four possible match entries.

12. The method according to claim 10, wherein each possible match entry comprises:

a possible distance value corresponding to a byte stream in a byte buffer;

a valid bit to indicate a valid status of the byte stream in the byte buffer; and at least one initial character from the byte stream in the byte buffer.

13. The method according to claim 12, wherein each possible match entry comprises two initial characters from the byte stream in the byte buffer.

14. The method according to claim 1, further comprising:

reading at least one byte stream character from the dictionary, the at least one byte stream character corresponding to at least one of the plurality of characters used to compute the hash address; and comparing the at least one byte stream character with the plurality of characters of the input data stream.

15. The method according to claim 14, further comprising discarding the distance value corresponding to the at least one byte stream character in response to a determination that the at least one byte stream character is different from the plurality of characters of the input data stream.

16. An apparatus to implement a deflate process in a compression engine, the apparatus comprising:

a hash table to hash a plurality of characters of an input data stream to provide a hash address;

a dictionary coupled to the hash table, the dictionary to provide a plurality of distance values in parallel based on the hash address, wherein the distance values are stored in the dictionary;

comparison logic coupled to the dictionary, the comparison logic to identify a matching distance value from the plurality of distance values; and encoding logic coupled to the comparison logic, the encoding logic to encode the matching distance value with a length value as a portion of a LZ77 code stream.

17. The apparatus according to claim 16, further comprising a byte buffer coupled to the dictionary and the comparison logic, the byte buffer to store a plurality of previous bytes of the input data stream, wherein the comparison logic is further configured to compare the input data stream in parallel with a plurality of byte streams from the byte buffer, the plurality of byte streams from the byte buffer corresponding to the plurality of distance values from the dictionary.

18. The apparatus according to claim 17, wherein the comparison logic is further configured to identify a longest matching byte stream of the plurality of byte streams.

19. The apparatus according to claim 18, wherein the comparison logic is further configured to compare about 16 bytes per cycle from each byte stream with corresponding bytes of the input data stream.

20. The apparatus according to claim 18, wherein the comparison logic is further configured to derive the length value from the longest matching byte stream of the plurality of byte streams.

21. The apparatus according to claim 18, further comprising a counter coupled to the comparison logic, the counter to count a number of matching bytes to identify the longest matching byte stream.

22. The apparatus according to claim 16, wherein the dictionary is further configured to update at least one dictionary entry at the end of a match operation to identify a longest matching byte stream from a byte buffer.

23. The apparatus according to claim 16, wherein the dictionary is further configured to update at least one dictionary entry in response to an operation to output a literal, wherein the literal comprises another character of the input data stream.

24. The apparatus according to claim 16, wherein the dictionary comprises approximately 2K dictionary entries, wherein each dictionary entry comprises a plurality of possible match entries.

25. The apparatus according to claim 16, wherein each possible match entry comprises:

a possible distance value corresponding to a byte stream in a byte buffer;

a valid bit to indicate a valid status of the byte stream in the byte buffer; and a plurality of initial characters from the byte stream in the byte buffer;

26. The apparatus according to claim 16, further comprising an input buffer coupled to the hash table, the input buffer to store the plurality of characters of the input data stream.

27. The apparatus according to claim 26, further comprising a Huffman encoder coupled to the encoding logic, the Huffman encoder to compress the LZ77 code stream according to a Huffman coding algorithm.

28. The apparatus according to claim 27, further comprising an output buffer coupled to the Huffman encoder, the output buffer to store the LZ77 code stream compressed according to the Huffman coding algorithm.

29. The apparatus according to claim 16, wherein the dictionary comprises a single-ported dictionary random access memory (RAM).

30. The apparatus according to claim 16, further comprising distance logic coupled to the dictionary, the distance logic to read at least one byte stream character from the dictionary and to compare the at least one byte stream character with the plurality of characters of the input data stream, wherein the at least one byte stream character corresponds to at least one of the plurality of characters used to compute the hash address.

31. The apparatus according to claim 30, wherein the distance logic is further configured to discard the distance value corresponding to the at least one byte stream character in response to a determination that the at least one byte stream character is different from the plurality of characters of the input data stream.

32. A computer program product comprising a computer useable storage medium to store a computer readable program that, when executed on a computer, causes the computer to perform operations comprising:

hash a plurality of characters of an input data stream to provide a hash address into a dictionary;

read a plurality of distance values in parallel from the dictionary based on the hash address, wherein the distance values are stored in the dictionary;

identify a matching distance value from the plurality of distance values; and encode the matching distance value with a length value as a portion of a LZ77 code stream.

33. The computer program product of claim 32, wherein the computer readable program, when executed on the computer, causes the computer to perform operations to:

compare the input data stream in parallel with a plurality of byte streams from a byte buffer, the plurality of byte streams corresponding to the plurality of distance values from the dictionary; and identify a longest matching byte stream of the plurality of byte streams.

34. The computer program product of claim 33, wherein the computer readable program, when executed on the computer, causes the computer to perform an operation to derive the length value from the longest matching byte stream of the plurality of byte streams.

35. The computer program product of claim 33, wherein the computer readable program, when executed on the computer, causes the computer to perform an operation to compare a plurality of bytes per cycle from each byte stream with corresponding bytes of the input data stream.

36. The computer program product of claim 35, wherein the computer readable program, when executed on the computer, causes the computer to perform an operation to compare up to 16 bytes per cycle from each byte stream with the corresponding bytes of the input data stream.

37. The computer program product of claim 32, wherein the computer readable program, when executed on the computer, causes the computer to perform an operation to update the dictionary at the end of a match operation to identify a longest matching byte stream from a byte buffer.

38. The computer program product of claim 32, wherein the computer readable program, when executed on the computer, causes the computer to perform an operation to update the dictionary in response to an operation to output a literal, wherein the literal comprises another character of the input data stream.

39. The computer program product of claim 32, wherein the computer readable program, when executed on the computer, causes the computer to perform an operation to store approximately 2K entries in the dictionary, wherein each entry comprises a plurality of possible match entries.

40. The computer program product of claim 32, wherein the computer readable program, when executed on the computer, causes the computer to perform operations to:

read at least one byte stream character from the dictionary, the at least one byte stream character corresponding to at least one of the plurality of characters used to compute the hash address; and compare the at least one byte stream character with the plurality of characters of the input data stream.

41. The computer program product of claim 40, wherein the computer readable program, when executed on the computer, causes the computer to perform an operation to discard the distance value corresponding to the at least one byte stream character in response to a determination that the at least one byte stream character is different from the plurality of characters of the input data stream.

42. An apparatus for deflate processing within a compression engine, the apparatus comprising:

means for accessing a dictionary entry in a dictionary, wherein the dictionary entry comprises a plurality of possible match entries corresponding to a combination of characters of an input data stream;

means for identifying a matching distance value from the plurality of possible match entries in the dictionary entry; and means for encoding the matching distance value with a length value as a portion of a LZ77 code stream.

* * * * *